(12) United States Patent
Toender et al.

(10) Patent No.: US 11,798,618 B2
(45) Date of Patent: Oct. 24, 2023

(54) SIGNAL ANALYZER AND METHOD OF PROCESSING DATA FROM AN INPUT SIGNAL

(71) Applicant: Rohde & Schwarz GmbH & Co. KG, Munich (DE)

(72) Inventors: Nico Toender, Munich (DE); Markus Freidhof, Munich (DE); Michael Reinhold, Munich (DE); Felix Haberstroh, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 351 days.

(21) Appl. No.: 16/685,931

(22) Filed: Nov. 15, 2019

(65) Prior Publication Data
US 2021/0151094 A1    May 20, 2021

(51) Int. Cl.
*G11C 11/4093* (2006.01)
*G01R 31/26* (2020.01)
(Continued)

(52) U.S. Cl.
CPC ...... *G11C 11/4093* (2013.01); *G01R 31/2603* (2013.01); *G01R 13/00* (2013.01);
(Continued)

(58) Field of Classification Search
CPC .... G11B 27/36; G09G 3/006; G09G 2350/00; G01R 13/0254; G01R 31/3171;
(Continued)

(56) References Cited

U.S. PATENT DOCUMENTS 4,510,571 A    4/1985   Dagostino et al.
5,371,842 A  * 12/1994  Easton ............... G01R 13/0227
                                                   345/440
(Continued)

FOREIGN PATENT DOCUMENTS

CA         3040940 A1 * 10/2020
CN       106707053 A  *  5/2017
(Continued)

*Primary Examiner* — Steven P Sax
(74) *Attorney, Agent, or Firm* — CHRISTENSEN O'CONNOR JOHNSON KINDNESS PLLC

(57) ABSTRACT

A signal analyzer for analyzing an input signal comprises at least one input for receiving the input signal, at least one acquisition unit for acquiring data assigned to the input signal, an acquisition memory for storing the acquired data, the acquisition memory being adapted to store data in at least one ring buffer, and an acquisition memory controller to control at least one of writing the acquired data in the acquisition memory and reading the acquired data from the acquisition memory. The acquisition memory controller comprises a data read module for reading data of the at least one ring buffer. The acquisition memory controller comprises a copy write module which taps data read by the data read module. The acquisition memory comprises an additional memory section. The copy write module is configured to write the data tapped into the additional memory section. Further, a method of processing data from an input signal is described.

13 Claims, 1 Drawing Sheet

(51) Int. Cl.
*G01R 13/00* (2006.01)
*G06F 3/14* (2006.01)
*G06F 7/00* (2006.01)

(52) U.S. Cl.
CPC ...... *G05B 2219/33292* (2013.01); *G06F 3/14* (2013.01); *G06F 7/00* (2013.01); *G09G 2350/00* (2013.01)

(58) Field of Classification Search
CPC .............. G01R 31/2603; G01R 13/00; H04L 25/03044; H04N 17/00; G06F 3/0484; G06F 3/14; G06F 7/00; G11C 11/4093; G05B 2219/33292
See application file for complete search history.

(56) References Cited

U.S. PATENT DOCUMENTS

| | | | | |
|---|---|---|---|---|
| 5,517,609 | A | * | 5/1996 | Guillemaud ........... G09G 5/395 345/501 |
| 5,613,103 | A | * | 3/1997 | Nobutani ............. G09G 3/3629 345/501 |
| 5,978,742 | A | | 11/1999 | Pickerd |
| 10,877,094 | B2 | * | 12/2020 | Wendler ........... G01R 31/31912 |
| 11,255,879 | B2 | * | 2/2022 | Guenther ............... G06F 3/0673 |
| 11,443,137 | B2 | * | 9/2022 | Schaefer ............... G06V 10/454 |
| 11,567,106 | B2 | * | 1/2023 | Bresser .................. G01R 23/16 |
| 11,580,382 | B2 | * | 2/2023 | Werner ................... G06N 3/044 |
| 2005/0053260 | A1 | * | 3/2005 | Worthington .......... G11B 27/36 382/100 |
| 2005/0071108 | A1 | * | 3/2005 | Kulidjian ............... G09G 3/006 702/117 |
| 2006/0031854 | A1 | * | 2/2006 | Godwin ................ G06F 3/1462 719/328 |
| 2007/0136012 | A1 | * | 6/2007 | Miller ................ G01R 31/3171 702/67 |
| 2007/0200550 | A1 | * | 8/2007 | Corredoura ........ G01R 13/0254 324/121 R |
| 2007/0250278 | A1 | * | 10/2007 | Sullivan ............. G01R 31/3167 702/67 |
| 2008/0262763 | A1 | * | 10/2008 | Sedeh ................. G06F 13/4027 702/66 |
| 2011/0242333 | A1 | * | 10/2011 | Zhu ........................ H04N 17/00 348/194 |
| 2012/0007874 | A1 | * | 1/2012 | Holcomb ........... G01R 13/0227 345/545 |
| 2014/0079111 | A1 | * | 3/2014 | Hui ................... H04L 25/03044 375/234 |
| 2016/0341766 | A1 | * | 11/2016 | Deverson ............. G01R 13/029 |
| 2017/0248634 | A1 | * | 8/2017 | Montijo ............. G01R 13/0272 |
| 2018/0299491 | A1 | * | 10/2018 | Holaday ............. G01R 13/0254 |
| 2019/0327444 | A1 | * | 10/2019 | Kim ........................ G06V 20/46 |
| 2020/0077892 | A1 | * | 3/2020 | Tran ..................... A61B 5/6806 |
| 2020/0191831 | A1 | * | 6/2020 | Clem ................. G01R 13/0254 |
| 2020/0200821 | A1 | * | 6/2020 | Freidhof ............ G01R 13/0254 |
| 2020/0309826 | A1 | * | 10/2020 | Schaefer ............. G01R 19/2509 |
| 2020/0322060 | A1 | * | 10/2020 | Sakamoto ............. G01M 11/02 |
| 2020/0380129 | A1 | * | 12/2020 | Dawson .................... G06F 1/28 |
| 2020/0412342 | A1 | * | 12/2020 | Haberstroh ........ H03H 17/0292 |

FOREIGN PATENT DOCUMENTS

| | | | | | |
|---|---|---|---|---|---|
| CN | 107818331 | A | * | 3/2018 | ............ G01R 13/00 |
| CN | 108804044 | A | * | 11/2018 | |
| CN | 109247062 | A | * | 1/2019 | ......... H04B 10/2507 |
| CN | 110412325 | A | * | 11/2019 | |
| CN | 110836993 | A | * | 2/2020 | |
| JP | 4615100 | B2 | * | 1/2011 | |
| JP | 2011038998 | A | * | 2/2011 | |
| JP | 2013104676 | A | * | 5/2013 | |
| TW | 201319577 | A | * | 5/2013 | |

\* cited by examiner

SIGNAL ANALYZER AND METHOD OF PROCESSING DATA FROM AN INPUT SIGNAL

FIELD OF THE DISCLOSURE

Embodiments of the present disclosure relate generally to a signal analyzer for analyzing an input signal. Further, embodiments of the present disclosure relate generally to a method of processing data from an input signal.

BACKGROUND

Signal analyzers for analyzing an input signal as well as respective methods are known in the state of the art. Those signal analyzers typically comprise an acquisition memory in which data acquired are stored that are assigned to the input signal. The acquired data can be accessed for a subsequent post-processing. For instance, the post-processing may relate to visualizing the respective data acquired.

Furthermore, it is known to perform measurements on the acquired data when post-processing the acquired data. The measurements intended may be complex and time-consuming such that the respective measurements have an impact on the acquisition of the data.

In the state of the art, different types for post-processing the acquired data are known which however typically yields significantly reduced acquisition rates or rather only allow few measurements on the acquired data such that no statistical evaluation of the acquired data is possible.

In fact, it is known that the acquired data are directly measured which means that the ongoing data acquisition is paused until the end of the respective measurements. This results in a significant decrease of the acquisition rate. It is further known that only the latest acquired data are measured during an update of the visualized data, which results in fewer measurements. Thus, no statistical evaluation of the acquired data is possible.

In summary, the systems and methods known in the state of the art always have to deal with the number of measurements to be performed on the acquired data and the acquisition rate.

Accordingly, there is a need for a signal analyzer and a method that provide the possibility to perform complex and time-consuming measurements without impairing data acquisition.

SUMMARY

Embodiments of the present disclosure provide a signal analyzer for analyzing an input signal. The signal analyzer in an embodiment comprises at least one input for receiving the input signal. The signal analyzer also comprises at least one acquisition unit for acquiring data assigned to the input signal. The signal analyzer also comprises an acquisition memory for storing the acquired data, wherein the acquisition memory is adapted to store data in at least one ring buffer. The signal analyzer also comprises an acquisition memory controller or control circuit(s) to control writing the acquired data in the acquisition memory and/or reading the acquired data from the acquisition memory. The acquisition memory controller comprises a data read module for reading data from the at least one ring buffer. The acquisition memory controller also comprises a copy write module which taps data read by the data read module. The acquisition memory comprises an additional memory section. The copy write module is configured to write the data tapped into the additional memory section.

Further, embodiments of the present disclosure provide a method of processing data from an input signal. In an embodiment, the method comprises the following steps:
receiving the input signal;
acquiring the input signal in order to obtain acquired data;
storing the acquired data in an acquisition memory, wherein the acquired data are stored in at least one ring buffer;
reading data from the at least one ring buffer;
tapping the data read; and
writing the data tapped into an additional memory section of an acquisition memory.

The main idea of the present disclosure relates to extracting data read from the acquisition memory, for example the at least one ring buffer, in order to write the data, namely the data extracted, into an additional memory section of the acquisition memory for further post-processing. Hence, the respective data can be provided for different post-processing, for instance for performing complex and time-consuming measurements without impairing data acquisition and/or post-processing the respective acquired data such as visualizing. The additional memory section of the acquisition memory relates to a reserved memory section in the acquisition memory ensuring that only the data tapped can be written into this specific section of the acquisition memory. Thus, it is ensured that writing the data tapped into the additional memory section does not have an influence on the acquisition rate since the additional memory section is a reserved one.

Typically, several data acquisition procedures are done in a subsequent manner in order to acquire the data from the at least one input signal. The several data acquisition procedures performed yield the acquired data.

Moreover, the entire data acquired are post-processed, for instance visualized. This means that the data read by means of the data read module correspond to the data acquired.

Furthermore, specific post-processing such as performing complex and time-consuming measurements is only done on a certain portion of the data acquired. In other words, the data tapped may relate to a portion of the data acquired. However, the data tapped may also relate to the entire data acquired.

In general, the signal analyzer and the method ensure that the continuous data acquisition is not affected by the complex and time-consuming measurements with regard to the acquisition rate. The data for the complex measurements are not overwritten by the continuous data acquisition due to the additional memory section of the acquisition memory, which is reserved for the data tapped.

Furthermore, the signal analyzer and the method ensure that the continuous data acquisition is not interrupted by acquired data not yet (post-)processed completely.

Moreover, the signal analyzer and the method ensure that as many complex measurements as possible can be performed without impairing the acquisition.

The at least one input of the signal analyzer may relate to an analog input for receiving an analog input signal. Alternatively, the at least one input may relate to a digital input for receiving a digital input signal. Moreover, the signal analyzer may generally have more than one input, for instance several analog inputs, several digital inputs or at least one analog input and at least one digital input.

Generally, the at least one input as well as the acquisition unit together form an acquisition channel of the signal receiver wherein the acquisition channel is connected with the acquisition memory so as to forward the acquired data to the acquisition memory.

Further, the acquisition unit connected with the input may comprise an analog-to-digital converter in order to digitize the analog input signal into a digitized one in order to acquire data from the digitized signal.

Generally, the signal analyzer may comprise several acquisition channels, namely several inputs as well as several acquisition units assigned to the respective inputs.

Furthermore, the acquisition unit may comprise a signal input that is assigned to the input of the signal analyzer. Hence, the input signal received via the at least one input of the signal analyzer is forwarded to the acquisition unit via the signal input of the acquisition unit for internal processing by means of the acquisition unit. Further, the acquisition unit may comprise an equalizer, a filter, a trigger and/or a decimator.

A trigger (event) may control stop of writing data to the ring buffer. Hence, it is ensured that the data are written to the ring buffer and read from the ring buffer in a controlled manner.

The acquisition memory may be established by at least one physical memory chip. Hence, the acquisition memory may also comprise several physical memory chips, namely separately formed physical memory chips.

In addition, the acquisition memory may comprise at least one cache memory, for example several cache memories. The cache memory or rather the cache memories may be used for storing data temporarily.

The acquisition memory may be established by a Double Data Rate (DDR) memory, for instance a DDR3 memory or rather a DDR5 memory.

The data read module may also be called extractor since the data read module extracts data from the acquisition memory, for example the at least one ring buffer. In some embodiments, the data read module or rather extractor reads one ring buffer after another ring buffer provided that the acquisition memory comprises several ring buffers.

The copy write module may also be called post-processing recorder since the copy write module writes the tapped data back into the acquisition memory, namely data that were stored previously in the acquisition memory, for example the at least one ring buffer.

The signal analyzer ensures a high acquisition rate, for instance four million waveforms per second.

As mentioned above, the copy write module is configured to make a copy of the data extracted from the at least one ring buffer. In some embodiments, a copy of an interesting or rather a relevant portion of the acquired data is made by the copy write module, wherein the respective data are forwarded and written to the additional memory section that ensures analyzing or rather post-processing the respective data offline irrespective of the acquisition of new data.

An aspect provides that the acquisition memory controller, for example the copy write module, is configured to decouple data acquisition from non-real-time measurements. In some embodiments, the data tapped and stored in the additional memory section may be used for time-consuming and complex measurements wherein the data tapped is stored in a reserved section of the acquisition memory. Thus, the respective tapped data have no influence on the acquisition of the respective signal. Accordingly, the data acquisition and the non-real-time measurements are decoupled from each other.

Another aspect provides that the copy write module is configured to make a copy of the data extracted from the at least one ring buffer. Put differently, a copy of the data extracted from the at least one ring buffer is made. Hence, the respective measurements may be performed on copied or rather extracted data such that the time-consuming and complex measurements do not have an influence on the data acquisition or rather its visualization.

According to an embodiment, a post-processor is provided that receives the data read from the data read module. The post-processor is configured to post-process the data read. Put differently, the data read are forwarded to a post-processor for post-processing the data read. Hence, a post-processing of the respective data is performed that is independent from the copy write module, as the copy write module taps the data read in the data processing line established between the data read module and the post-processor.

For instance, the post-processor is configured to visualize the data read. In other words, the post-processor visualizes the data read. Hence, the data forwarded to the post-processor by the data read module are visualized appropriately. For instance, all data acquired are visualized by the post-processor.

The copy write module may tap the data read from the post-processor. In other words, the data read are tapped from the post-processor. Thus, a tapping line ends in the post-processor. The tapping line also ends in the copy write module that processes the tapped data read. Hence, the tapping line via which the data is tapped connects the copy write module with the post-processor in this specific embodiment. Generally, the tapping line is always connected with the copy write module wherein the tapping line ends at the data read module, the post-processor or in a data path between the data read module and the post-processor.

Another embodiment provides that the acquisition memory controller comprises at least one copy read module for reading the data from the additional memory section. Hence, the copy read module is configured to read the data that were stored in the additional memory section by the copy write module in order to forward the respective data for post-processing, for example for performing measurements on the data.

Further, a measurement module may be provided that is connected with the copy read module. The measurement module is configured to perform measurements on the data read from the additional memory section. Accordingly, it is ensured that complex and time-consuming measurements can be performed on the respective data assigned to the input signal without influencing the data acquisition, as the measurement module receives the respective data from the reserved additional memory section via the copy read module.

For instance, the additional memory section may comprise at least two reserved portions, for instance three reserved portions. The number of reserved portions may relate to the respective process used for writing the data read into the additional memory section. In some embodiments, a single buffer process, a dual buffer process or rather a triple buffer process may be used for writing the data read into the additional memory section.

Accordingly, the data read may be written into the additional memory section by a single buffer process, a dual buffer process or a triple buffer process.

In the single buffer process, there might be only one reserved portion in the additional memory section for storing the tapped data. Writing the tapped data into the reserved portion may be triggered by reading previously tapped data stored in the additional memory section, for example the single reserved portion. This means that the respective data are available at the end of the process of writing the tapped data into the additional memory section, for example the reserved portion. If no writing action is triggered, the respective data in the copy write module may be discarded and nothing may be written to the additional memory section, for example the reserved portion.

In the dual buffer process, there might be two reserved portions in the additional memory section. The tapped data are always written to the free portion of the additional memory section. When the complex measurements of the data in the reserved portion have been completed and, thus, the reserved portion is released, the writing action of the tapped data into the additional memory section is triggered. At the end of the post-processing of the data stored in the additional memory section, namely the reading action, the reserved portions are exchanged, i.e., the reserved portion just written to is immediately available for the complex measurements and the reserved portion just released is written to. If no reading action is triggered, the respective data in the copy write module are always written to the same reserved portion in the additional memory section.

In the triple buffer process, there might be three reserved portions in the additional memory section. The triple buffer process is substantially similar to the dual buffer process. However, the data are written alternately into the two free reserved portions. When the complex measurements of the reserved portions are finished, the data for the complex measurements are immediately available again.

Irrespective of the process mentioned above, the respective data are stored in a decoupled memory section after the writing action of the tapped data has been completed wherein the data is available for any length of time for the complex and possibly time-consuming measurements.

With respect to the single buffer process, the tapped data is available at the end of the writing action.

With respect to the dual buffer process, if no writing of data tapped is active at the moment of reading previously tapped data stored in the additional memory section, the respective data is immediately available provided that at least one acquisition has been post-processed, namely written into the additional memory section, since the last reading. If writing of data tapped is active at the moment of reading previously tapped data stored in the additional memory section, the respective data is available at the end of the writing of the tapped data.

With respect to the triple buffer process, tapped data is available immediately if at least one acquisition has been post-processed, namely written to the additional memory section, since the reading action of previously tapped data stored in the additional memory section.

Furthermore, the tapping and writing may be initiated manually or automatically by means of a post-processing counter. Hence, an operator may initiate the specific post-processing of certain portions of the acquired data manually, for instance via a respective interface.

Alternatively or rather in a different operation mode of the signal analyzer, the tapping and writing may be initiated automatically due to an initiation signal issued by the post-processing counter that may count the number of acquired data that has been processed.

The tapping and writing may be stopped by means of an interrupt. Hence, the stop signal provided by the interrupt may be issued automatically. The interrupt may relate to a hardware interrupt or a software interrupt.

For instance, the signal analyzer may be an oscilloscope. Hence, the oscilloscope may comprise signal analyzing functions, for example offline measurement functionalities.

In addition to the data path used for post-processing the acquired data such as visualizing, another data path is provided to copy at least a portion of the data acquired to the reserved additional memory section.

Generally, the data acquired is extracted at least partly for performing measurements on the extracted portion of the acquired data wherein the (entire) data acquired is also post-processed differently, for instance displayed or rather visualized.

For these two different purposes mentioned above, the signal analyzer comprises the different data paths, namely the data path for forwarding the (entire) data acquired to the post-processing, which is also called processing line, as well as the other data path, also called tapping line, via which at least the portion of the acquired data is extracted from and forwarded to the measurement module that performs measurements on the data extracted subsequently. As described above, the additional memory section may comprise different reserved portions depending on the buffer processes used.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
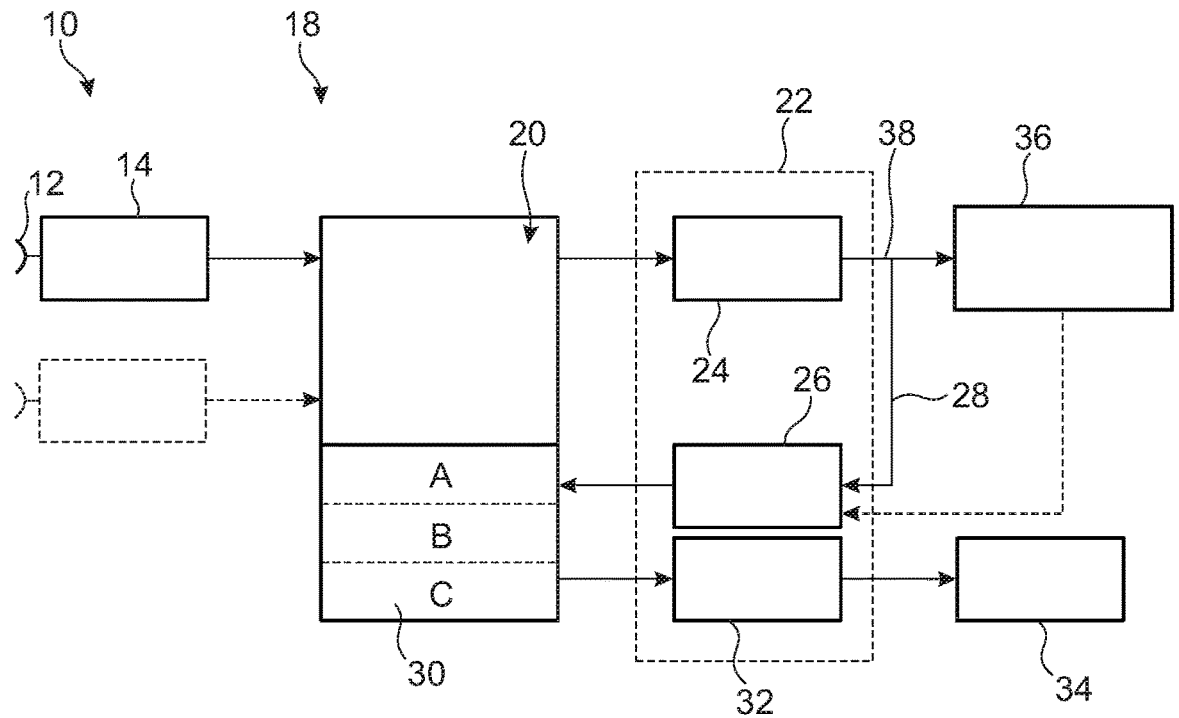
FIG. 1 schematically shows an overview of a representative embodiment of a signal analyzer according to the present disclosure.

In FIG. 1, a signal analyzer 10 is shown that is established by an oscilloscope. In the shown embodiment, the signal analyzer 10 comprises an input 12 for receiving an input signal. The input 12 is connected with an acquisition unit 14 that acquires data assigned to the input signal received. The input 12 and the acquisition unit 14 together establish an acquisition channel 16 of the signal analyzer 10.

Generally, the signal analyzer 10 may comprise several acquisition channels as indicated by the dashed lines in FIG. 1. Hence, the signal analyzer 10 may have several inputs 12 as well as several acquisition units 14.

The input 12 may relate to an analog input or rather a digital input. In case of an analog input, the acquisition unit 14 comprises an analog-to-digital converter in order to convert the analog input signal into a digitized one in order to acquire the respective data from the input signal.

The signal analyzer 10 also comprises an acquisition memory 18 that is connected with the acquisition channel 16, for example directly with the acquisition unit 14. The acquisition memory 18 is configured to store the acquired data that is received from the acquisition unit 14. The acquisition memory 18 is adapted to store data obtained in at least one ring buffer 20 assigned to the acquisition memory 18.

Figure 2:
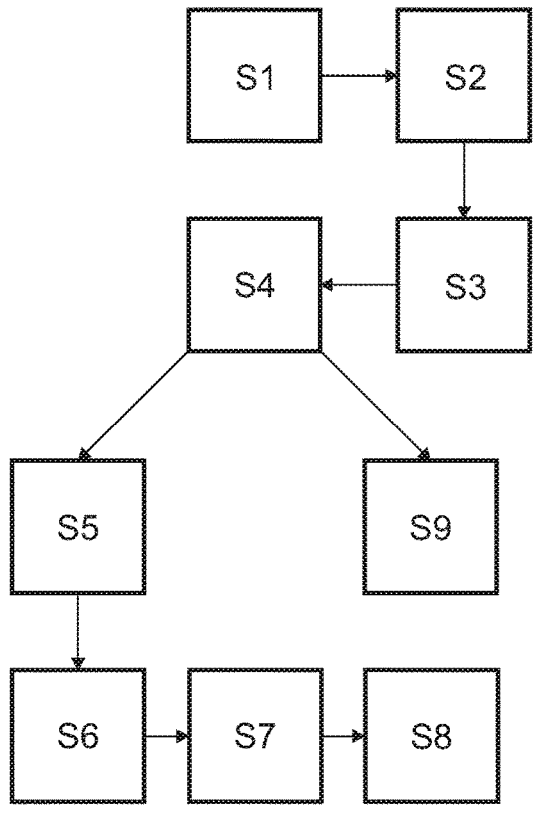
FIG. 2 shows a flow-chart representing a representative embodiment of a method of processing data from the input signal according to the present disclosure.

The signal analyzer 10 further comprises an acquisition memory control circuit or controller 22 that controls writing the acquired data in the acquisition memory and/or reading the acquired data from the acquisition memory 20, as will be described later with respect to FIG. 2. The acquisition memory controller 22 comprises a data read module 24 that is also called extractor. The data read module 24 reads data of the at least one ring buffer 20 so as to provide the data read for post-processing. In some embodiments, the data read module 24 can be implemented in software or in hardware or in a combination of software and hardware.

Further, the acquisition memory controller 22 comprises a copy write module 26 that taps data read by the data read module 24. As shown in FIG. 1, the copy write module 26 is connected via a tap line 28 that is assigned to the output of the data read module 24 such that the data read by means of the data read module 24 can be tapped by means of the copy write module 26 as will be described later with respect to FIG. 2 in more detail. Alternatively to the shown embodiment, the copy write module 26 may also tap the data read from the post processor 36 directly as indicated by the dashed line in FIG. 1. In some embodiments, the copy write module 26 can be implemented in software or in hardware or in a combination of software and hardware.

The copy write module 26 is connected with the acquisition memory 18 such that the data tapped can be written (back) into the acquisition memory 18, for example an additional memory section 30 provided by the acquisition memory 18.

In addition, the acquisition memory control 22 comprises a copy read module 32 that is also connected with the additional memory section 30 of the acquisition memory 18. The copy read module 32 is configured to read previously tapped data that was stored in the additional memory section 30 by the copy write module 26. In some embodiments, the copy read module 32 can be implemented in software or in hardware or in a combination of software and hardware.

The copy read module 32 is also connected with a measurement module 34 that receives the data read from the additional memory section 30 by the copy read module 32. In some embodiments, the copy read module 32 is configured to perform measurements on the respective data received.

In addition, the signal analyzer 10 comprises a post-processor 36 that is assigned to the data read module 24 such that the data read from the data read module 24 is forwarded to the post-processor 36 directly. Generally, a processing line 38 is provided between the data read module 24 and the post-processor 36. Hence, the processing line 38 originates from the data read module 24 and ends at the post-processor 36.

The copy write module 26 taps the respective data read within that processing line 28 or at the data read module 24 directly or rather the post-processor 36 directly. Generally, the post-processor 36 may be configured to visualize the respective data received via the data read module 24.

In some embodiments, the copy write module 26 tapping the data read makes a copy of the data extracted from the at least one ring buffer 20 such that a copy of the respective data is forwarded to the additional memory section 30 of the acquisition memory 18.

It is further shown in FIG. 1 that the additional memory section 30 may be divided into three different portions labeled with A, B and C. The optional different portions A, B, C of the additional memory section 30 may be necessary depending on the process used for writing into and/or reading from the additional memory section 30, for instance using a single buffer process, a dual buffer process or a triple buffer process.

Generally, copying the data extracted from the at least one ring buffer 20 by the acquisition memory controller 22, for example the copy write module 26, ensures that data acquisition/visualization is decoupled from non-real-time measurements of the respective data.

In some embodiments, the measurements are performed by the measurement module 34 that receives the respective data from the additional memory section 30 via the copy read module 32 located between the additional memory section 30 and the measurement module 34.

The signal analyzer 10 is generally configured to perform a method of processing data from the input signal received via the input 12 as will be described hereinafter with reference to FIG. 2.

In a first step S1, an input signal is received via the input 12.

In a second step S2, the input signal is acquired by means of the acquisition unit 14 in order to obtain acquired data.

In a third step S3, the acquired data are stored in the acquisition memory 18, for example the at least one ring buffer 20.

In a fourth step S4, the data are read from the at least one ring buffer 20. This may be done by the acquisition memory controller 22, for example the data read module 24, also called extractor.

In a fifth step S5, the data read by the data read module 24 are tapped by the copy write module 26. The copy write module 26 may be connected to the processing line 38 via the tapping line 28. Alternatively, the copy write module 26 is connected directly to the data read module 24 or rather the post-processor 36 via the tapping line 28.

In a sixth step S6, the data tapped is written into the additional memory section 30 of the acquisition memory 18 so as to provide a copy of the acquired data or rather the data read for further processing, for example for performing complex and time-consuming measurements on the respective data.

In a seventh step S7, the data tapped and written into the additional memory section 30 is read from the additional memory section 30 by means of the copy write module 32.

In an eighth step S8, the data read from the additional memory section 30 is forwarded to the measurement module 34 that performs (complex and/or time-consuming) measurements on the respective data obtained, namely the data extracted from the processing line 38.

In a ninth step S9, the data read is forwarded from the data read module 24 to the post-processor 36 via the processing line 38 for post-processing the respective data, for instance visualizing the respective data obtained.

Generally, step S9 may be performed after step S4 as soon as data is read from the acquisition memory 18, namely the ring buffer 20, by means of the data read module 24. In other words, step S9 may be done prior to step S5, between steps S5 and S6, between steps S6 and S7, between steps S7 and S8 or after step S8.

In general, the data read may be written into the additional memory section 30 by a single buffer process, a dual buffer process or a triple buffer process. Furthermore at least the tapping and writing, namely steps S5 and S6, are initiated manually or automatically by a post-processing counter. Moreover, at least the tapping and writing, namely steps S5 and S6, is stopped by an interrupt.

In general, the signal analyzer and the method ensure that the continuous data acquisition is not affected with regard to the acquisition rate by the complex and time-consuming measurements performed by the measurement module 34 since the respective section in the acquisition memory 18 are separated from each other. In other words, data acquisition/visualization and performing measurements on the acquired data are decoupled from each other.

The data read module 24, the copy write module 26, the copy read module 32, the measurement module 34, the post-processor 36, or other components of the signal analyzer device described herein may include, in some embodiments, logic for implementing the technologies and methodologies described herein. This logic of these components can be carried out in either hardware or software, or a combination of hardware and software. In some embodiments, one or more of these components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, one or more of these components includes a microprocessor and a memory storing logic modules and/or instructions. In an embodiment, one or more of these components includes one or more ASICs having a plurality of predefined logic components. In an embodiment, one or more of these components includes one or more FPGA having a plurality of programmable logic components. In an embodiment, one or more of these components includes hardware circuit implementations (e.g., implementations in analog circuitry, implementations in digital circuitry, and the like, and combinations thereof). In an embodiment, one or more of these components includes combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analyzer for analyzing an input signal, comprising:
   at least one input for receiving said input signal;
   at least one acquisition unit for acquiring data assigned to said input signal;
   an acquisition memory for storing said acquired data, said acquisition memory being adapted to store data in at least one ring buffer; and
   an acquisition memory controller to control at least one of writing said acquired data in said acquisition memory and reading said acquired data from said acquisition memory,
   said acquisition memory controller comprising a data read module for reading data from said at least one ring buffer;
   said acquisition memory controller comprising a copy write module which taps data read by said data read module;
   said acquisition memory comprising an additional memory section; and
   said copy write module being configured to write said data tapped into said additional memory section, such that the data tapped is written back into the acquisition memory;
   wherein said additional memory section is a reserved memory section in the acquisition memory,
   wherein only said data tapped is enabled to be written into said additional memory section,
   wherein said signal analyzer is an oscilloscope, and
   wherein said at least one acquisition unit, said acquisition memory comprising said ring buffer and said additional memory section, and said acquisition memory controller are integrated into the oscilloscope,
   wherein a post-processor is provided that receives said data read from said data read module, and wherein said post-processor is configured to post-process said data read,
   wherein said acquisition memory controller comprises at least one copy read module for reading said data from said additional memory section, and
   wherein a measurement module is provided that is connected with said copy read module, said measurement module being configured to perform measurements on said data read from said additional memory section.

2. The signal analyzer according to claim 1, wherein said copy write module is configured to make a copy of said data extracted from said at least one ring buffer.

3. The signal analyzer according to claim 1, wherein said post-processor is configured to visualize said data read.

4. The signal analyzer according to claim 1, wherein said copy write module taps said data read from said post-processor.

5. The signal analyzer according to claim 1, wherein the measurement module is configured to perform measurements on data assigned to said input signal.

6. The signal analyzer according to claim 1, wherein said additional memory section comprises at least two reserved portions.

7. A method of processing data from an input signal, comprising:
- receiving said input signal;
- acquiring, by at least one acquisition unit, said input signal in order to obtain acquired data;
- storing said acquired data in an acquisition memory, wherein said acquired data are stored in at least one ring buffer;
- reading, by an acquisition memory controller, data from said at least one ring buffer;
- tapping, by said acquisition memory controller, said data read; and
- writing said data tapped into an additional memory section of said acquisition memory, such that the data tapped is written back into the acquisition memory;
- wherein said additional memory section is a reserved memory section in the acquisition memory, wherein only said data tapped is enabled to be written into said additional memory section,
- wherein the at least one acquisition unit, the acquisition memory comprising said ring buffer and said additional memory section, and the acquisition memory controller are integrated into an oscilloscope,
- wherein said data read are forwarded to a post-processor for post-processing said data read,
- wherein said acquisition memory controller comprises at least one copy read module for reading said data from said additional memory section, and
- wherein a measurement module is provided that is connected with said copy read module, and
- wherein measurements are performed, by means of the measurement module, on said data read from said additional memory section.

8. The method according to claim 7, wherein a copy of said data extracted from said at least one ring buffer is made.

9. The method according to claim 7, wherein said post-processor visualizes said data read.

10. The method according to claim 7, wherein said data read are tapped from said post-processor.

11. The method according to claim 7, wherein said data read are written into said additional memory section by a single buffer process, a dual buffer process or a triple buffer process.

12. The method according to claim 7, wherein said tapping and writing is initiated manually or automatically by a post-processing counter.

13. The method according to claim 7, wherein said tapping and writing is stopped by an interrupt.

* * * * *